(12) United States Patent
Oliver

(10) Patent No.: US 8,492,929 B2
(45) Date of Patent: Jul. 23, 2013

(54) DEVICE, SYSTEM AND METHOD FOR DIRECTLY GENERATING ALTERNATING CURRENT ELECTRICITY FROM PHOTOVOLTAIC CELLS

(76) Inventor: Jason Allen Oliver, Arcadia, IN (US)

( * ) Notice: Subject to any disclaimer, the term of this patent is extended or adjusted under 35 U.S.C. 154(b) by 0 days.

(21) Appl. No.: 13/488,019

(22) Filed: Jun. 4, 2012

(65) Prior Publication Data
US 2012/0242155 A1 Sep. 27, 2012

Related U.S. Application Data

(63) Continuation of application No. 12/566,327, filed on Sep. 24, 2009, now Pat. No. 8,222,770.

(60) Provisional application No. 61/194,114, filed on Sep. 24, 2008.

(51) Int. Cl.
*H03K 3/00* (2006.01)

(52) U.S. Cl.
USPC ............................................ 307/106; 307/151

(58) Field of Classification Search
USPC .................................. 136/244; 307/106, 151
See application file for complete search history.

(56) References Cited

U.S. PATENT DOCUMENTS

| | | | | |
|---|---|---|---|---|
| 4,577,052 A | * | 3/1986 | Schutten et al. | 136/246 |
| 6,774,299 B2 | * | 8/2004 | Ford | 136/244 |

* cited by examiner

*Primary Examiner* — Daniel Cavallari
(74) *Attorney, Agent, or Firm* — Bruce J. Bowman

(57) ABSTRACT

A method utilizing a device and/or system presented herein for generating alternating current (a/c) electricity directly from photovoltaic cells utilize an array of photovoltaic cell pairs that are each connected in anti-parallel to form an a/c junction. The system, device and method mechanically gradually exposes and shades photovoltaic cell pairs to sunlight to generate alternating current electricity at an a/c junction of the solar cell pairs. Gradually and alternately exposing and shading the two anti-parallel connected solar cells of each solar cell pair causes the amplitude and polarity of the electricity at the a/c junction to gradually rise and fall to produce alternating current electricity. The gradual, alternating exposure and shading of the two anti-parallel solar cells is accomplished by mechanically covering and exposing the solar cell pairs. This is efficiently accomplished by a rotating segmented disc positioned over an array of solar cell pairs.

8 Claims, 14 Drawing Sheets

DEVICE, SYSTEM AND METHOD FOR DIRECTLY GENERATING ALTERNATING CURRENT ELECTRICITY FROM PHOTOVOLTAIC CELLS

This patent application is a continuation of patent application Ser. No. 12/566,327 filed Sep. 24, 2009 now U.S. Pat. No. 8,222,770 entitled "Device, System And Method For Directly Generating Alternating Current Electricity From Photovoltaic Cells", which claims the benefit of and/or priority to U.S. Provisional Patent Application Ser. No. 61/194,114 filed Sep. 24, 2008, entitled "Two or Three Phase Solar Alternator With 50-60 Cycle Phase Synchronizer" the entire contents of which are specifically incorporated herein by this reference.

BACKGROUND OF THE INVENTION

1. Field of the Invention

The present invention relates to photovoltaics (i.e. technology and research related to the application of photovoltaic cells in producing electricity for practical use) and, more particularly, to devices, systems and methods for generating alternating current electricity from photovoltaic cells.

2. Background Information

The demand and need for clean and renewable energy is becoming more urgent as earth undergoes global climate changes. Generation of electricity from coal produces over 50% of the carbon dioxide released into the atmosphere each year. Coal and other fossil fuels will also eventually run out. The hydroelectric power generation of electricity is limited to places where there is an adequate water source. Nuclear energy for the creation of electricity has the drawback of creating nuclear waste. However, one type of clean renewable energy is solar energy or sunlight. Solar energy is a constant source of clean energy that can shine on all areas of the surface of the planet.

Solar energy or sunlight can be converted into electricity by a photovoltaic cell. A photovoltaic cell known as a solar cell captures and converts sunlight into electricity. A solar cell is made from a semi-conducting material (a semiconductor) such as silicon that absorbs the sunlight which generates a flow of electricity through the solar cell. Because of the properties of semiconductors, positive and negative terminals of the solar cell are static and electron flow from a solar cell is uni-directional (i.e. the electricity can only flow in one direction). Thus, as with all photovoltaic cells, the solar cell produces only direct current (d/c) electricity. The problem with direct current electricity is that direct current electricity is difficult to transmit any appreciable distance, which limits its use. Thus, alternating current electricity is more usable than direct current electricity. Moreover, most electrical devices utilize alternating current (a/c) electricity.

Various prior art devices have attempted to provide suitable alternating current electricity from photovoltaic or solar cells. For instance, U.S. Pat. No. 4,075,034 issued to Butler on Feb. 21, 1978 (hereinafter, "Butler") provides a solar converter for producing variable amplitude alternating current waveforms directly from solar energy by using a photo-voltaic cell bank array formed of a plurality of weighted photo-voltaic segments. A multi-sided high speed, rotating and light concentrating concave mirror system provides light on and past the weighted segments of the photo-voltaic bank to produce instantaneous output which are proportional to the number of cells scanned in each segment. A simulated alternating current (a/c) waveform is produced by suitable arrangement of the photo-voltaic segments. The simulated a/c waveform of Butler and its fragile manner (glass mirrors) of producing the simulated a/c waveform by the high speed rotating mirror is not efficient. Moreover, Butler is not easily scalable to produce larger voltages/amperes nor is it relatively maintenance free.

In U.S. Patent Publication No. 2005/0034750 by Rabinowitz published Feb. 17, 2005 (hereinafter, "Rabinowitz"), a solar cell alternating current generator is provided that uses a dynamic spinning ensemble of mini-mirrors to both concentrate and modulate rays from the sun onto a photovoltaic collector array. The focusing and superimposed spinning action produces single phase and multiphase alternating current electricity. The problem with Rabinowitz is again, the use of glass mirrors, the need for focusing the mini-mirrors and maintain their high speed spinning is not efficient.

In U.S. Pat. No. 6,774,299 issued to Ford on Aug. 10, 2004 (hereinafter, "Ford"), a solar alternating current electricity generator is provided that utilizes a rotating, partitioned array of photovoltaic cells. Contact brushes and wiring are provided to transfer the electric current to an applied load. The drawback to Ford is the need for contact brushes and wiring to generate the alternating current electricity. Moreover, the rotating photovoltaic cell vanes of Ford are not efficient.

In U.S. Pat. No. 4,728,878 issued to Anthony on Mar. 1, 1988 (hereinafter, "Anthony"), a solar energy electric generating system is provided for space vehicles which directly generates alternating current from ambient light without power conversion. Light incident to photocell arrays is mechanically or electrically gated to produce fluctuating direct current (d/c) electricity. A number of transforming devices are provided to convert the fluctuating d/c current to alternating current (a/c). Through variation of the frequency and duty cycle of the pulsing output voltage, frequency and phase relative to a reference may be controlled. However, with the Anthony solar energy electric generating system, the mechanical gating provides a square wave that is then conditioned to provide an alternating current waveform.

Last, in U.S. Pat. No. 4,577,052 issued to Schutten et al. on Mar. 18, 1986 (hereinafter, "Schutten"), an alternating current solar cell is provided by connecting solar cells (P/N junctions) in anti-parallel between a pair of main terminals. Light is provided alternately on the P/N junctions through a mirror system that splits the beam and causes the split beam to impinge on the P/N junctions.

It is clear from the above that the prior art devices for generating alternating current electricity directly from photovoltaic or solar cells are complicated, difficult to align and maintain, and cannot provide adequate scaling for small and large a/c current production.

In view of the above, it is desirable to have a solar powered alternating current (a/c) electricity generator, system and method that produces single or multi-phase a/c electricity that is simple, efficient and easily scalable in voltage and/or amperage.

SUMMARY OF THE INVENTION

The present invention is a system, device and method for directly generating alternating current electricity from photovoltaic cells. The system, device and method mechanically gradually exposes and shades photovoltaic cell pairs connected in anti-parallel to sunlight to generate alternating current electricity at an a/c junction of the solar cell pairs. Gradually and alternately exposing and shading the two anti-parallel connected solar cells of each solar cell pair causes the amplitude and polarity of the electricity at the a/c junction to gradually rise and fall to produce alternating current electricity. The gradual, alternating exposure and shading of the two anti-parallel solar cells is accomplished by mechanically covering and exposing the solar cell pairs.

In particular, while one solar cell of an anti-parallel connected solar cell pair undergoes gradual exposure to sunlight from 0% exposure (100% shaded) of the solar cell electricity generating area to 100% exposure (0% shaded) of the solar cell electricity generating area, the other solar cell of the solar cell pair undergoes gradual shading from sunlight from 0% shaded (100% exposure) to 100% shaded (0% exposure). Such gradual, alternating exposure and covering of each solar cell of each anti-parallel connected solar cell pair is periodic. The rate of exposure and shading determines frequency.

In one form, a rotating disc situated over the solar cell pairs has spaced apart openings forming coverings between each opening to alternately expose and shade the solar cell pairs during rotation. A direct current motor is utilized to rotate the segmented disc. The motor is preferably powered by separate solar cells.

The present invention also provides a phase synchronizer for maintaining a desired alternating current frequency. The phase synchronizer controls the motor to control rotation of the segmented disc.

The present invention makes solar energy a viable, cost effective, environmentally friendly option for residential and/or commercial use. The present invention is capable of being used on a minute, small or large scale through appropriate scaling the solar cell a/c electricity generator and/or the use of a plurality thereof. Solar cell a/c electricity generator arrays can easily produce the power equivalent to an average power plant today, while being environmentally friendly enough to be located proximate a playground, school or in any urban environment. Large scale solar cell a/c electricity generator arrays can be easily set up even in the most remote places in the world. The present invention reduces the need of other forms of power. Moreover, the present solar cell a/c electricity generator can be set up and used anywhere.

It is thus an object of the present invention to produce alternating current electricity of specific frequencies, single or three phase, from solar cells in a cost efficient and simple manner.

BRIEF DESCRIPTION OF THE DRAWINGS

The above mentioned and other features, advantages and objects of this invention, and the manner of attaining them, will become apparent and the invention itself will be better understood by reference to the following description of an embodiment of the invention taken in conjunction with the accompanying drawings, wherein.

Like reference numerals indicate the same or similar parts throughout the several figures.

A description of the features, functions and/or configuration of the components depicted in the various figures will now be presented. It should be appreciated that not all of the features of the components of the figures are necessarily described. Some of these non discussed features as well as discussed features are inherent from the figures. Other non discussed features may be inherent in component geometry and/or configuration.

DETAILED DESCRIPTION OF AN EMBODIMENT OF THE INVENTION

Referring to FIGS. 1-5, there is depicted various views of an exemplary embodiment of a photovoltaic alternating current (a/c) electricity generator, generally designated 10, fashioned in accordance with the present principles. The photovoltaic a/c generator 10 is embodied as a solar cell a/c electricity generator 10, but it should be appreciated that a photovoltaic a/c electricity generator fashioned in accordance with the present principles may use photovoltaic cells other than solar cells.

Figure 3:
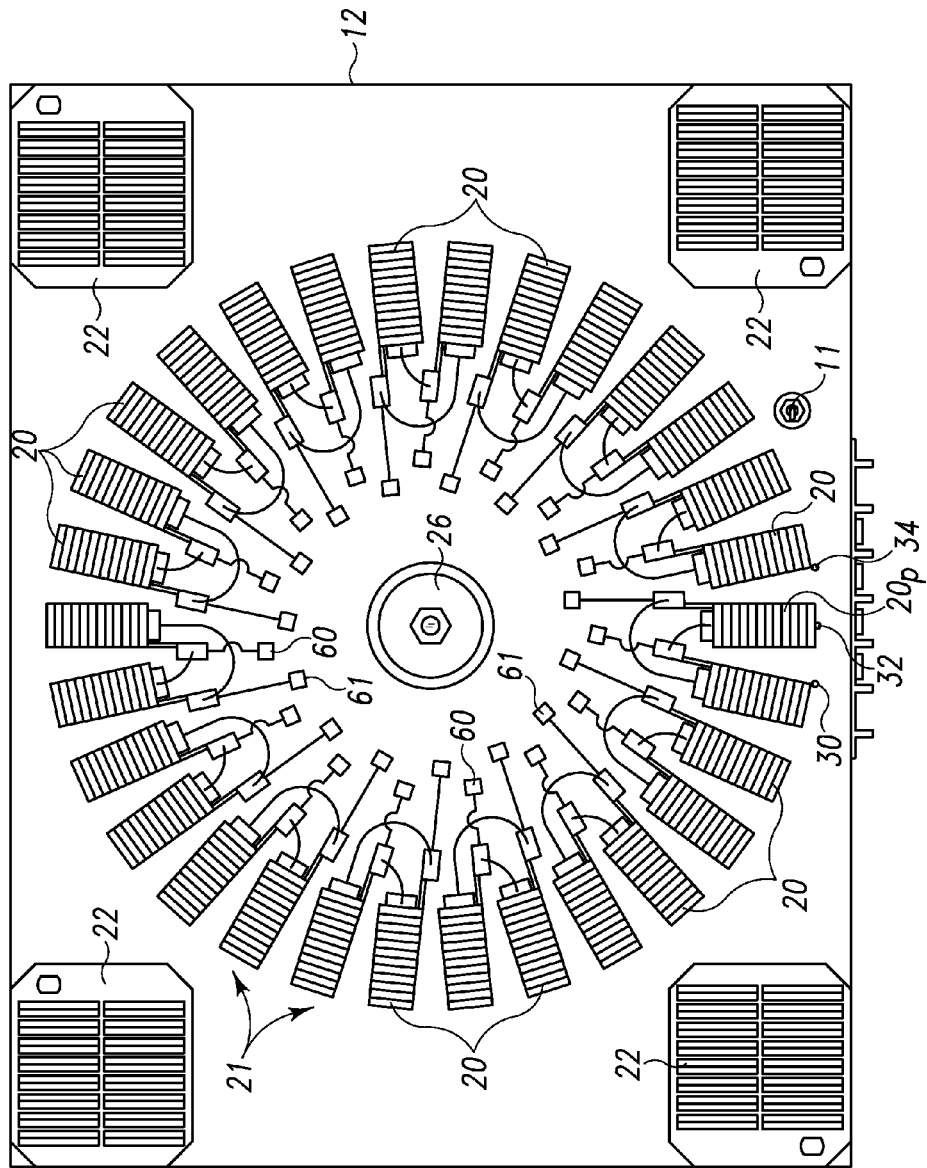
FIG. 3 is a perspective view of the photovoltaic a/c electricity generator of FIG. 1 with the rotating disk thereof removed.

The solar cell a/c electricity generator 10 has a base, frame or other mounting structure 12 ("base 12") that supports the various components thereof. The base 12 may be formed of wood, plastic or other suitable material which is preferably, but not necessarily, a non conducting material. It should be understood that while the base 12 is shown as a box or a box-like structure, the base may be a substrate, board or other suitable mounting or supporting structure. The base 12 includes an alternating current (a/c) electricity production portion 14 formed by a disk 15 and a plurality of photovoltaic or solar cells 20 (hereinafter, "solar cells 20"). As best seen in FIG. 3, the plurality of solar cells 20 is arranged in a generally circular array 21 on an upper surface 13 of the base 12. It should be appreciated that arrays other than circular may be used within the present principles. It should also be appreciated that while the solar cells 20 are shown as rectangles, the size and shape of the solar cells 20 may be otherwise, such as truncated conical, triangular, polygonal or square.

Figure 1:
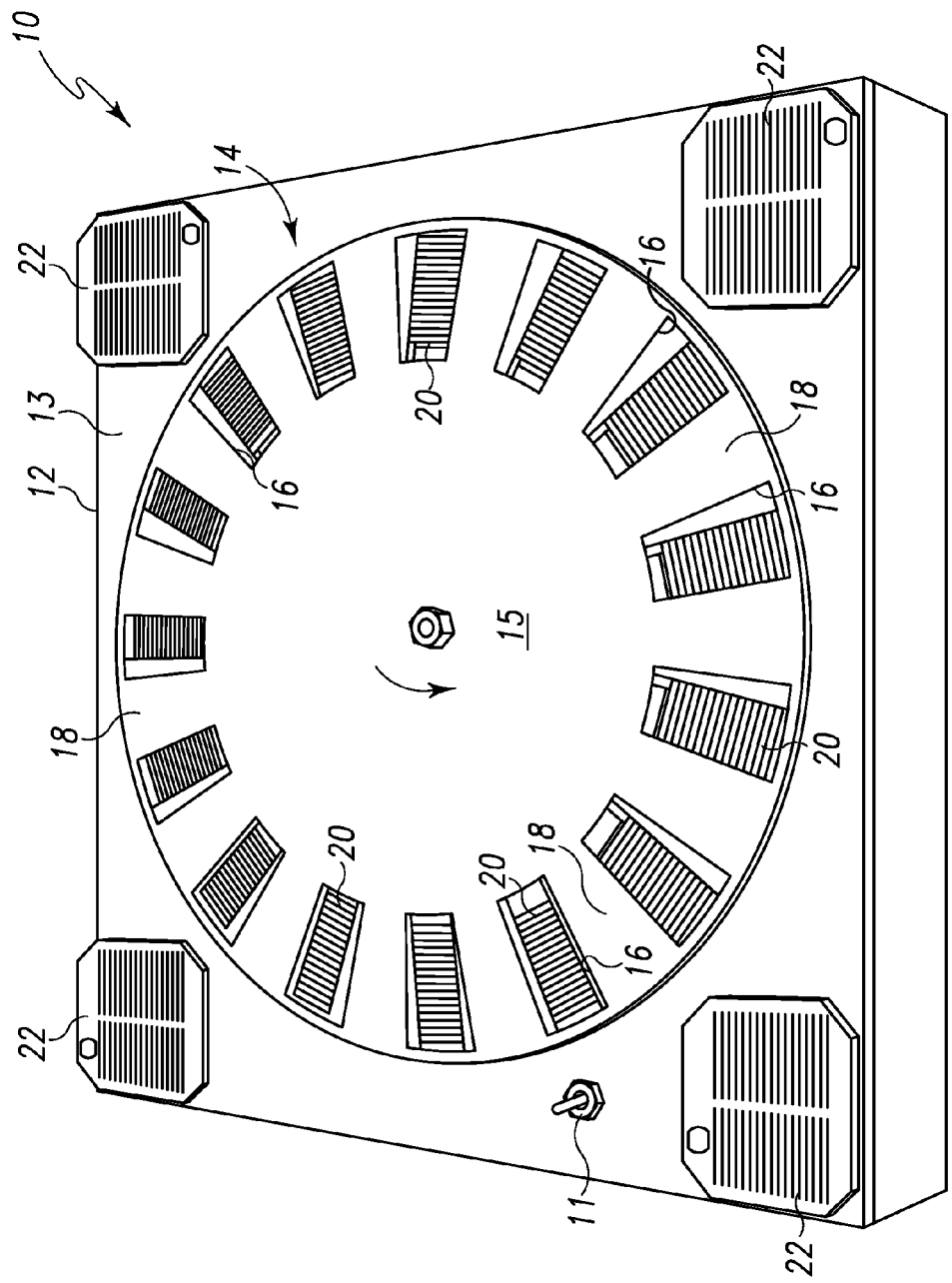
FIG. 1 is a perspective view of a photovoltaic alternating current (a/c) electricity generator fashioned in accordance with the principles of the present invention.
Figure 2:
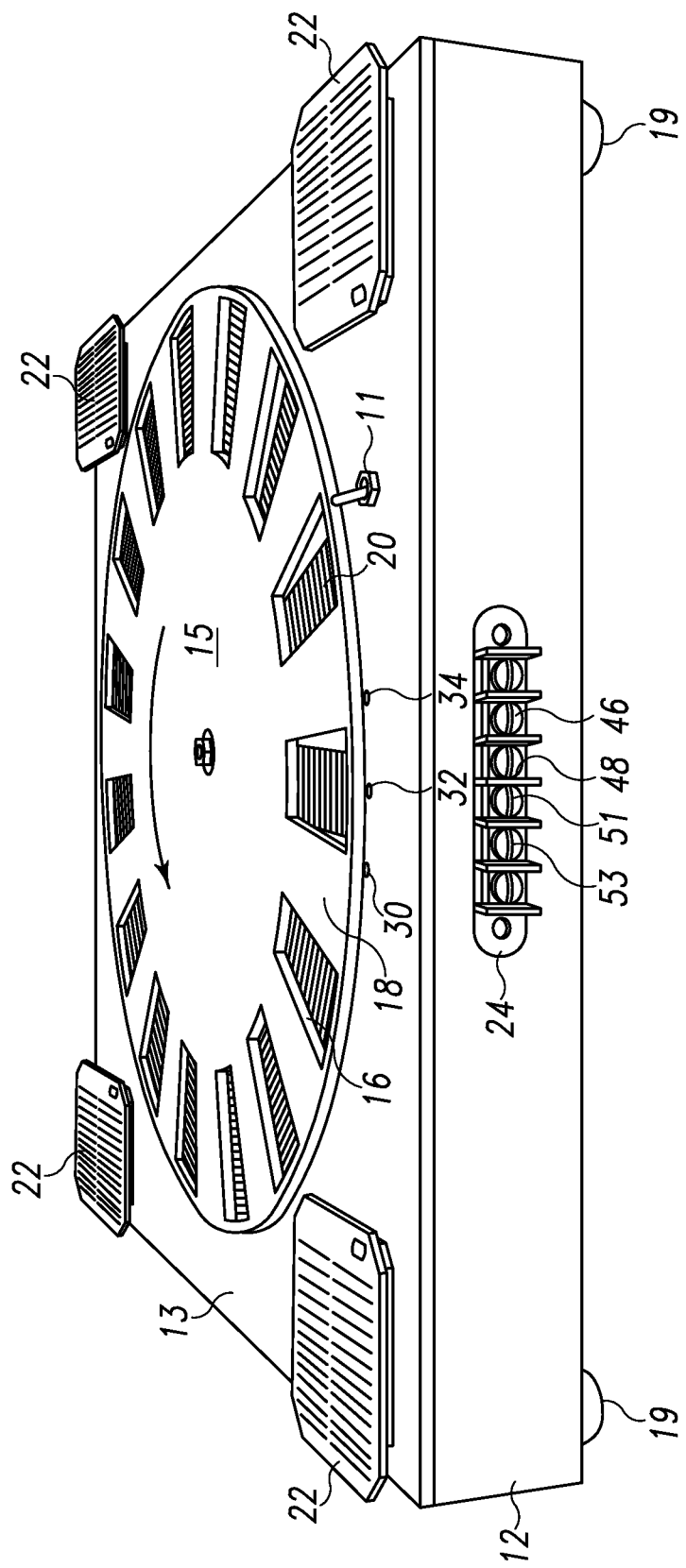
FIG. 2 is a lower perspective view of the photovoltaic a/c electricity generator of FIG. 1 taken from another side of the generator.
Figure 4:
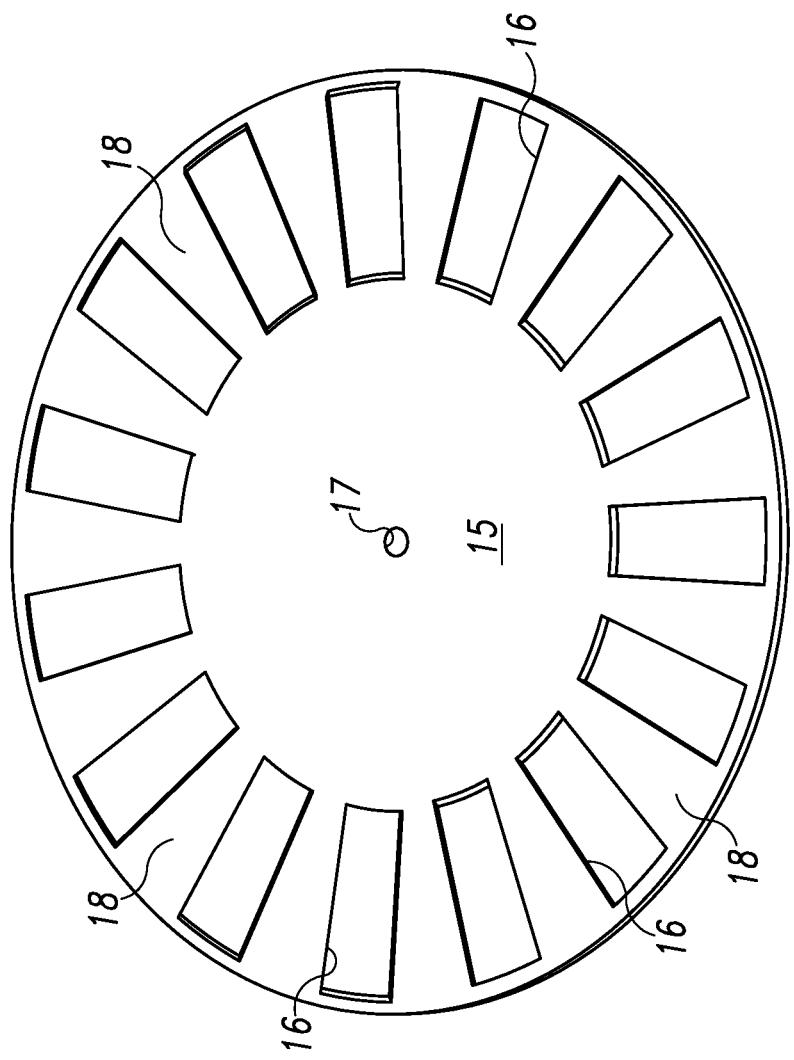
FIG. 4 is a perspective view of the rotating disk of the photovoltaic a/c electricity generator of FIG. 1.

As best seen in FIG. 4, the disc 15 has a generally flat body made of a sunlight blocking material that is generally the circumference of the solar cell array 21 in order to extend over the solar cell array 21 when in use (see, e.g., FIGS. 1 and 2). The disc 15 is also preferably made of a lightweight material that resists warping or is not susceptible to warping. The disc 15 is preferably reflective either inherently or via a coating, film, overlay or the like. It should be appreciated that the disc 15 may be partially reflective or non-reflective if desired. The disc 15 has a plurality of cutouts, openings, windows or the like 16 ("cutouts 16") formed thereabout. The size and shape of the cutouts 16 generally correspond to the size and shape of the solar cells 20 and particularly is sized and shaped to allow total exposure of a solar cell 20 to sunlight when the cutout 16 is positioned over the solar cell 20. The cutouts 16 are situated and spaced on the disc 15 so as to define a plurality of covers, coverings, blocks or the like 18 ("coverings 18"). The coverings 18 are sized and shaped to completely cover or block a solar cell 20 when the covering is over the solar cell 20.

The cutouts 16 and coverings 18 are alternately radially situated about the disc 15. The number of cutouts 16 corresponds by ½ to the number of solar cells 20 so that the number of coverings 18 corresponds by ½ to the number of solar cells 20. Therefore, when the disc 15 is situated on frame 12 and over the solar cell array 21, the cutouts 16 and coverings 18 expose ½ of the total solar cell array area and cover ½ of the total solar cell array area. As the disc 15 rotates over the array 21 of solar cells 20, the cutouts 16 and coverings 18 continuously gradually expose and cover the array of solar cells.

The disc 15 is rotated over the solar cell array 21 by a direct current motor 26 (see, e.g., FIG. 3) that is supported by the base 12. Rotation may be either clockwise or counterclockwise. A counterclockwise rotation of the disc 15 is represented in the figures by the curved arrow(s). The motor 26 is coupled to a phase synchronizer 40 via a motor connection 44 (see FIG. 5). The phase synchronizer 40 provides control/control signals to the motor 26 for varying the rotational speed of the disc 15. Rotational speed of the disc 15 determines the frequency of resultant alternating current(s) from the solar cell a/c electricity generator 10. Additionally, the phase synchronizer 40 determines phase of the resultant a/c electricity relative to a predetermined phase or phase value (e.g. 60 Hz) and causes the motor 26 to speed up or slow down if necessary.

Figure 5:
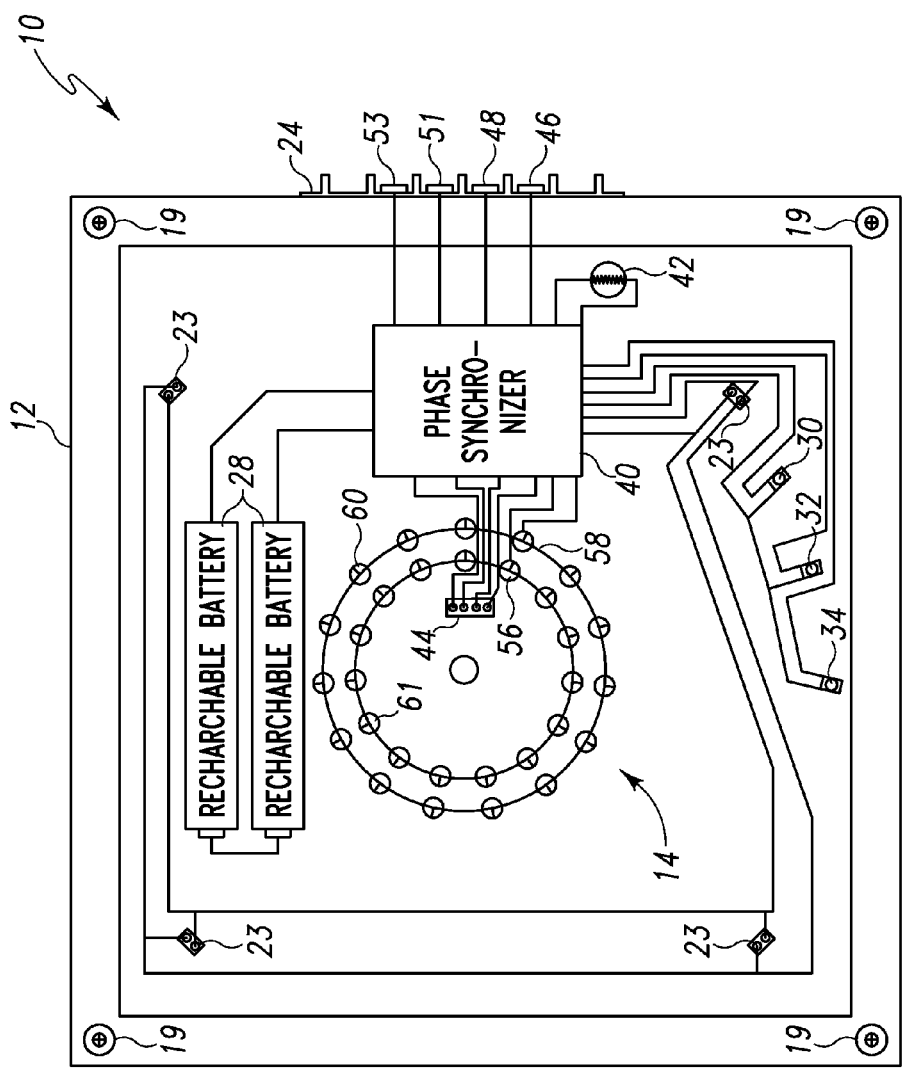
FIG. 5 is a schematic view of the underside connections of the photovoltaic a/c electricity generator of FIG. 1.

The motor 26 is powered by photovoltaic (solar) cells 22 that are situated on the base 12 so as to be continuously exposed to any sunlight. As best depicted in FIG. 5, the solar cells 22 are connected via connectors 23 to provide the proper voltage and amperage to the motor 26 and motor controller of the phase synchronizer 40) for properly operating the motor 26 for rotation of the disc 15. If desired, rechargeable batteries 28 may be connected to the phase synchronizer 40 that charge with energy from the solar cells 22 and provide startup energy for the motor 26.

The solar cell a/c electricity generator 10 may include a power on/off switch 11 for making the solar cell a/c electricity generator 10 operable or not operable. Alternately, or in addition, the solar cell a/c electricity generator 10 may include a light sensor 42 (shown in FIG. 5) that senses when sunlight is present to then turn on the solar cell a/c electricity generator 10. Other configurations may be used.

As can be discerned from FIGS. 1 and 2, rotation of the disc 15 causes the cutouts 16 and coverings 18 to alternately expose and cover adjacent solar cells 20. The faster that the solar cells 20 are exposed and covered (rotation speed of the disc 15), the higher the frequency of a/c electricity produced. The slower that the solar cells 20 are exposed and covered (rotation speed of the disc 15), the lower the frequency of the a/c electricity produced. Since the solar cells are wired in anti-parallel, an alternating current is generated between the a/c junction of the solar cell pairs as the solar cell pairs are alternately, gradually exposed and covered. Alternately stated, the total solar cell area of a solar cell pair comprises 100% where one solar cell of the solar cell pair defines 50% of the total area and the other solar cell of the solar cell pair defines the other 50% of the total area. The one solar cell of an anti-parallel connected solar cell pair undergoes gradual exposure to sunlight from 0% exposure (100% shaded) of the solar cell electricity generating area to 100% exposure (0% shaded) of the solar cell electricity generating area, the other solar cell of the solar cell pair undergoes gradual shading from sunlight from 0% shaded (100% exposure) to 100% shaded (0% exposure). Such gradual, alternating exposure and covering of each solar cell of each anti-parallel connected solar cell pair is periodic.

This periodic sequence is illustrated in FIGS. 8A through 8E. FIGS. 8A through 8E are a representation of the manner in which two solar cells of a solar cell pair are alternately, gradually exposed and covered to produce an a/c waveform. The principles of the present invention are applicable to any connection configuration of solar cell pairs, whether opposite one another as in FIGS. 8A through 8E, or adjacent one another as in FIG. 3.

Figure 8A:
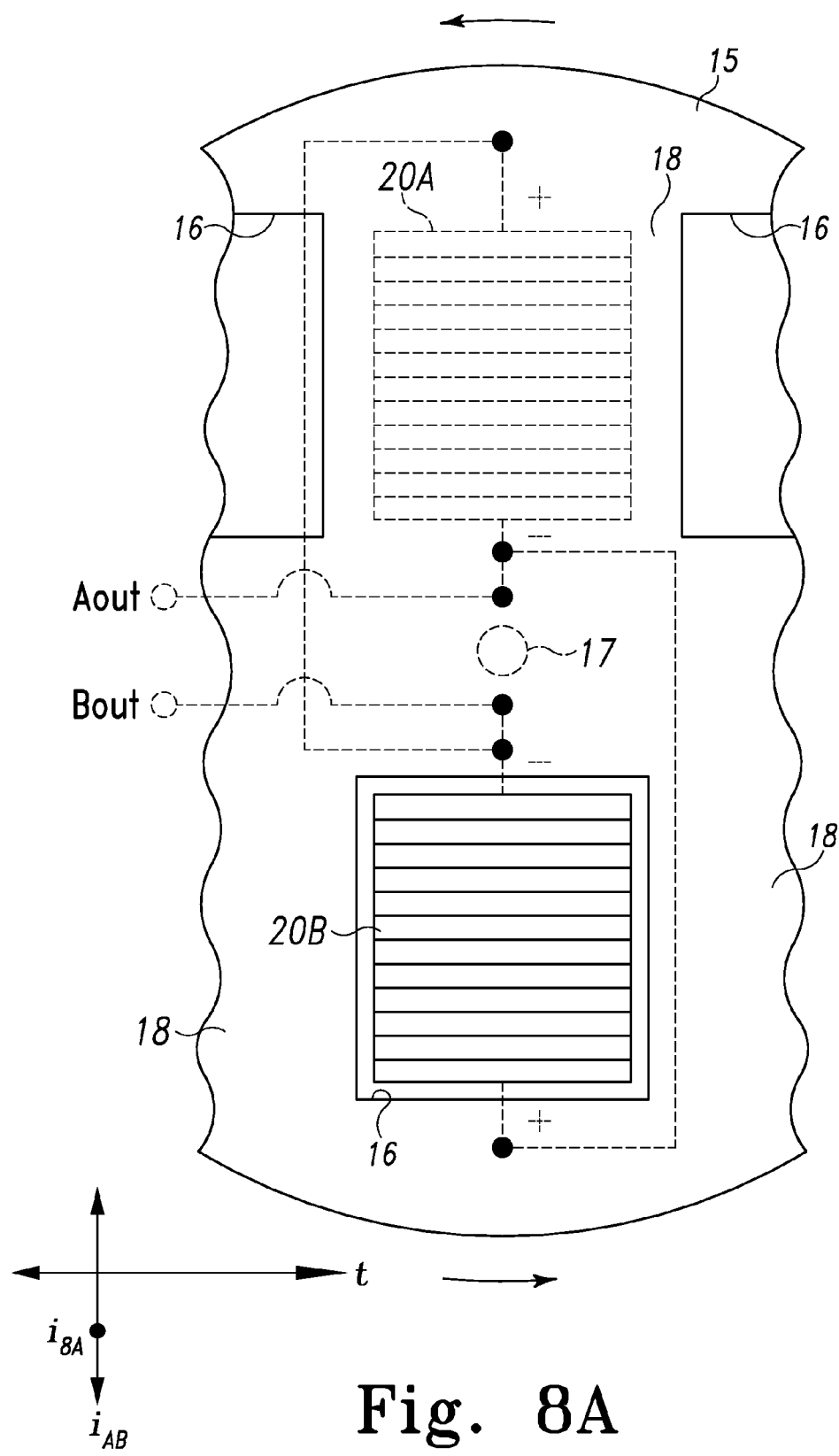
FIG. 8A is a first diagram in a sequence of representative diagrams illustrating the manner of generating a/c electricity from a photovoltaic cell pair of a photovoltaic cell pair array of the photovoltaic a/c electricity generator of FIG. 1.
Figure 8B:
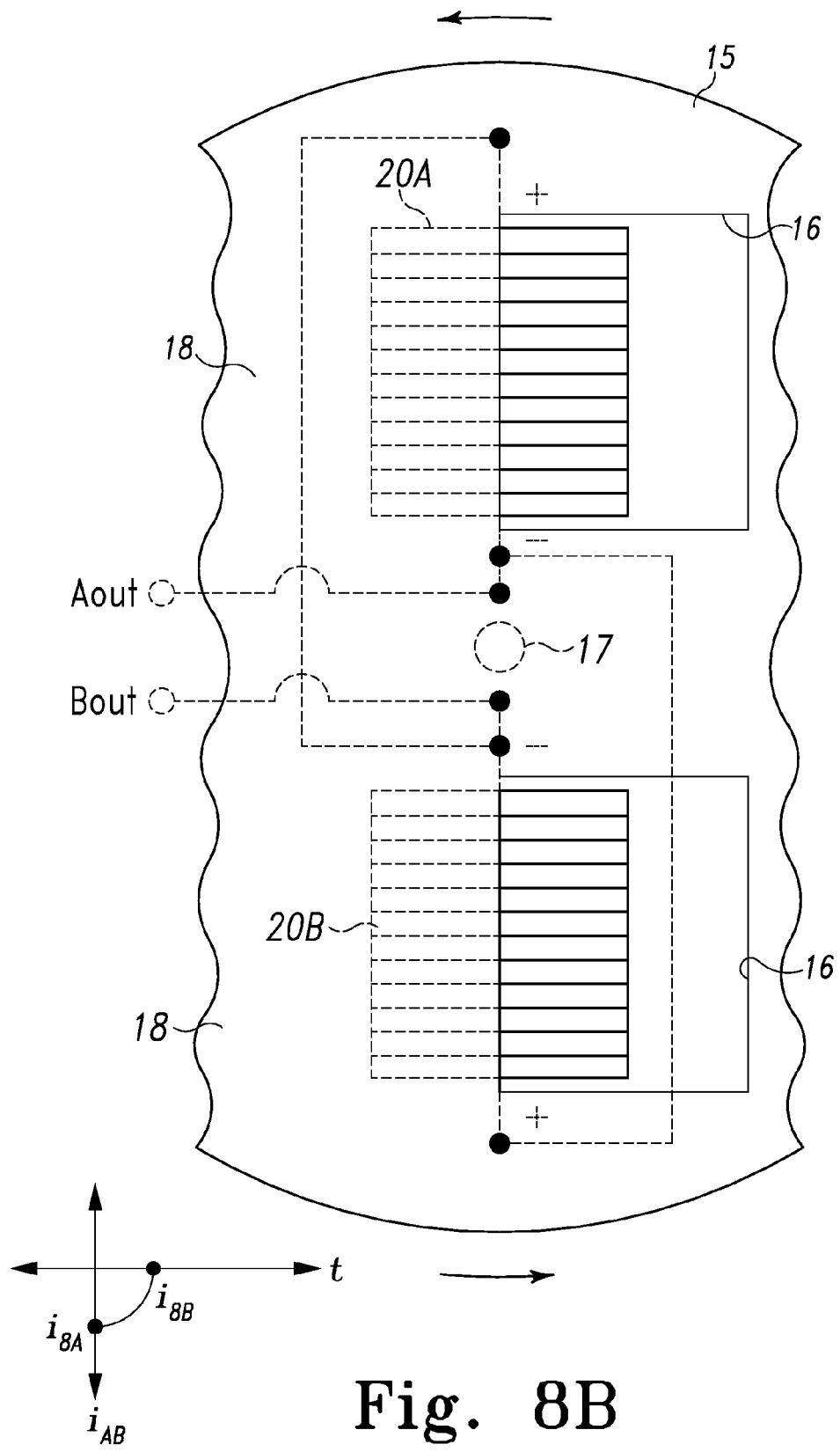
FIG. 8B is a second diagram in the sequence of representative diagrams illustrating the manner of generating a/c electricity from a photovoltaic cell pair of a photovoltaic cell pair array of the photovoltaic a/c electricity generator of FIG. 1.

FIG. 8A is an arbitrary beginning to the sequence wherein there is represented a negative current at the output terminals $A_{out}$ and $B_{out}$ of the solar cell pair, at its peak negative amplitude. In FIG. 8A, solar cell 20B of a solar cell pair is 100% exposed (0% covered) while solar cell 20A is 0% exposed (100% covered). Particularly, a cutout 16 is fully over the solar cell 20B thus fully exposing solar cell 20B, while at the same time, a covering 18 is fully over the solar cell 20A thus fully shading (covering or blocking) the solar cell 20A. A peak negative current is thus provided at output terminals $A_{out}$ and $B_{out}$ which is shown on the graph of FIG. 8A as current point $i_{8A}$. In FIG. 8B of the sequence, the rotating disc 15 has moved slightly counterclockwise such that the opening 16 that was totally exposing the solar cell 20B is now exposing only ½ (and/or covering ½) of the area of the solar cell 20B, while the covering 18 that was totally shading the solar cell 20A is now covering only ½ (and/or exposing ½) of the area of the solar cell 20A. This results in a zero (0) current at the output terminals $A_{out}$ and $B_{out}$ as shown on the graph of FIG. 8B as current point $i_{8B}$. It should be appreciated that the rotational movement of the disc 15 from point shown in FIG. 8A to that shown in FIG. 8B gradually exposes and covers the solar cells, as described above, to create the gradual and not stepped a/c waveform as depicted in the graph of FIG. 8B.

Figure 8C:
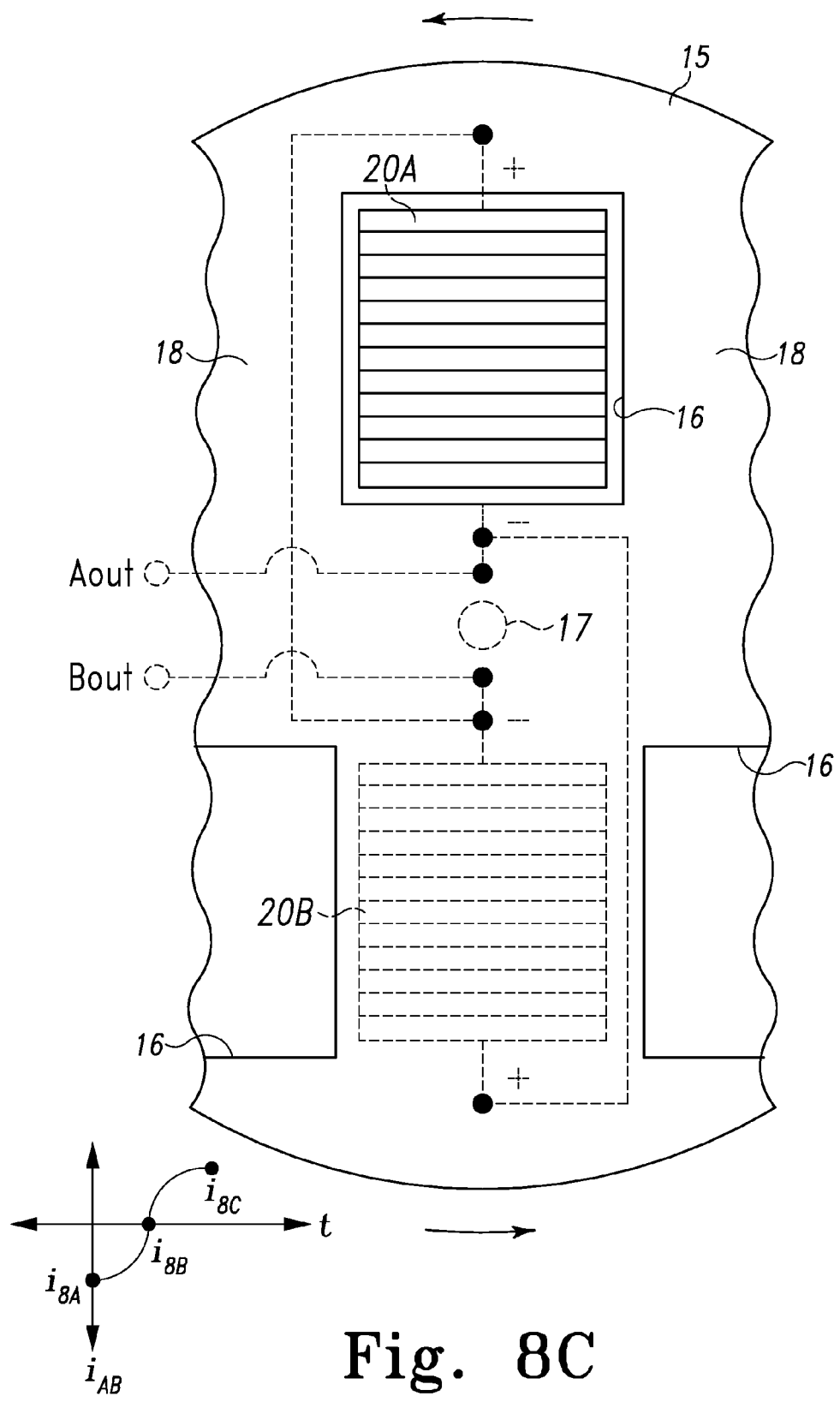
FIG. 8C is a third diagram in the sequence of representative diagrams illustrating the manner of generating a/c electricity from a photovoltaic cell pair of a photovoltaic cell pair array of the photovoltaic a/c electricity generator of FIG. 1.

In FIG. 8C of the sequence, the rotating disc 15 has moved further slightly counterclockwise. In FIG. 8C, solar cell 20A of a solar cell pair is now 100% exposed (0% covered) while solar cell 20B is now 0% exposed (100% covered). A cutout 16 is fully over the solar cell 20A thus fully exposing solar cell 20A, while at the same time, a covering 18 is fully over the solar cell 20B thus fully shading (covering or blocking) the solar cell 20B. A peak positive current is thus provided at output terminals $A_{out}$ and $B_{out}$ which is shown on the graph of FIG. 8A as current point $i_{8C}$. Again, it should be appreciated that the rotational movement of the disc 15 from point shown in FIG. 8B to that shown in FIG. 8C gradually exposes and covers the solar cells, as described above, to create the gradual and not stepped a/c waveform as depicted in the graph of FIG. 8C.

Figure 8D:
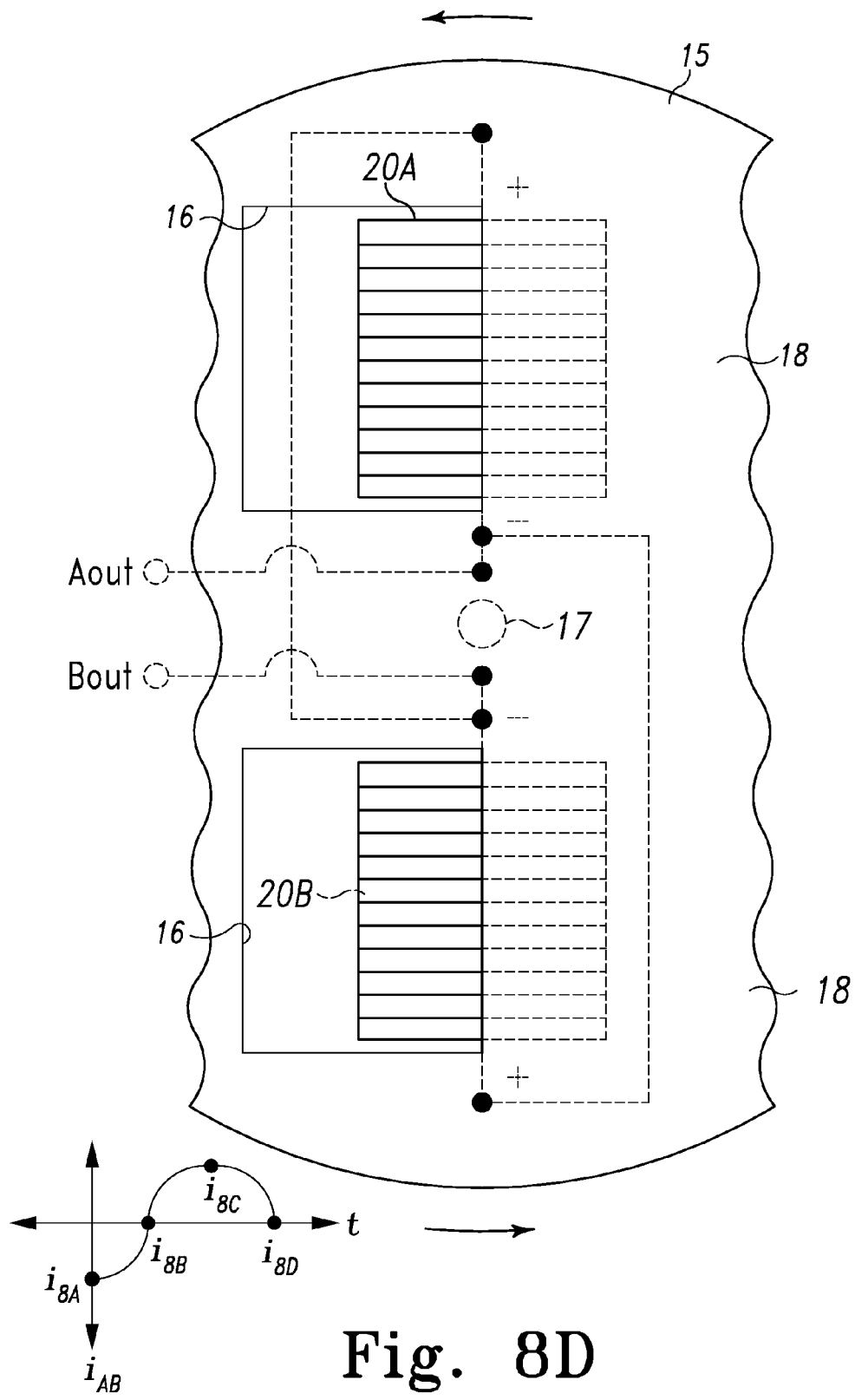
FIG. 8D is a fourth diagram in the sequence of representative diagrams illustrating the manner of generating a/c electricity from a photovoltaic cell pair of a photovoltaic cell pair array of the photovoltaic a/c electricity generator of FIG. 1.

In FIG. 8D of the sequence, the rotating disc 15 has moved further slightly counterclockwise such that the opening 16 that was totally exposing the solar cell 20A is now exposing only ½ (and/or covering ½) of the area of the solar cell 20A, while the covering 18 that was totally shading the solar cell 20B is now covering only ½ (and/or exposing ½) of the area of the solar cell 20B. While opposite to that of FIG. 8B, this results in a zero (0) current at the output terminals $A_{out}$ and $B_{out}$ as shown on the graph of FIG. 8D as current point $i_{8D}$. Again, it should be appreciated that the rotational movement of the disc 15 from point shown in FIG. 8C to that shown in FIG. 8D gradually exposes and covers the solar cells, as described above, to create the gradual and not stepped a/c waveform as depicted in the graph of FIG. 8D.

Figure 8E:
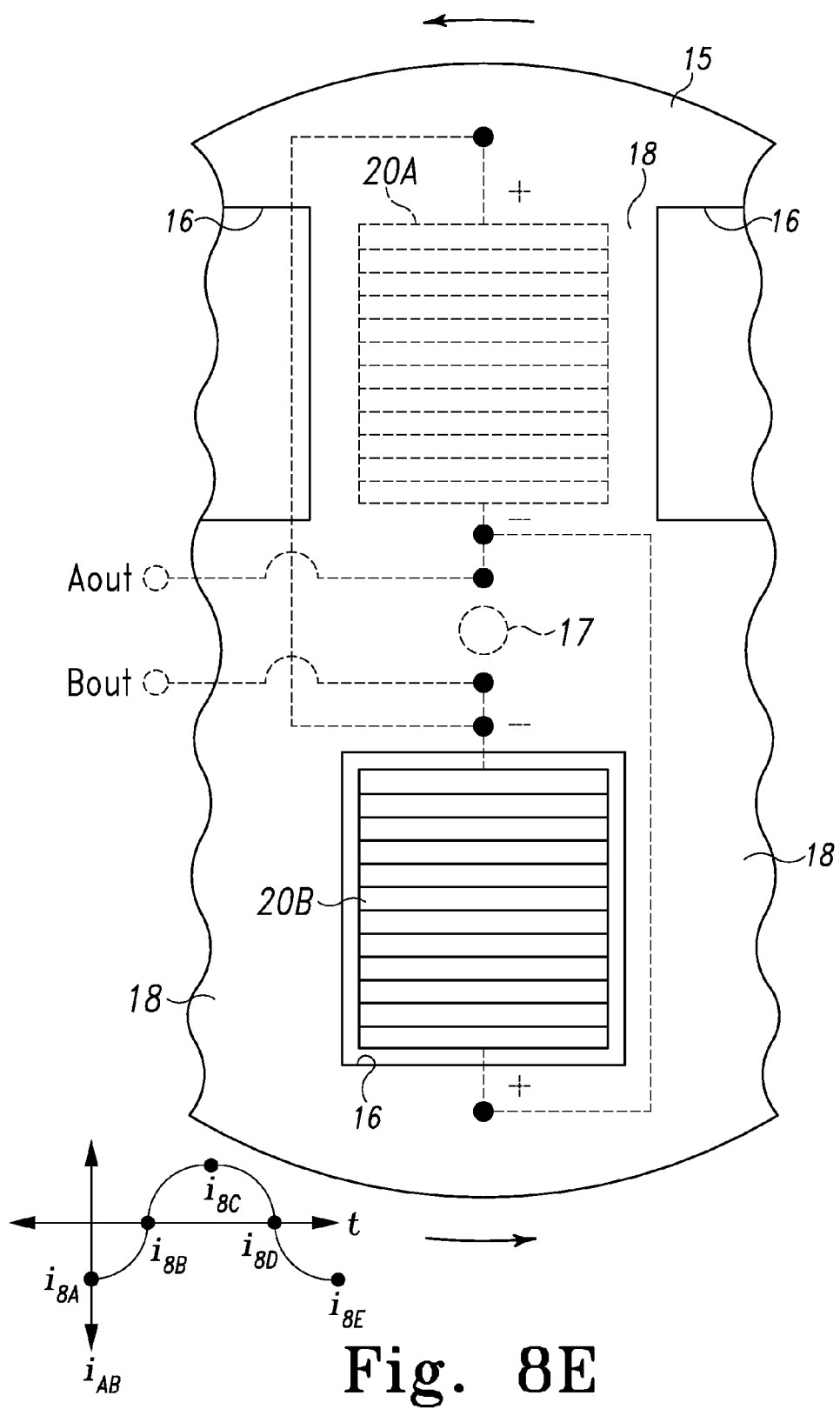
FIG. 8E is a fifth diagram in the sequence of representative diagrams illustrating the manner of generating a/c electricity from a photovoltaic cell pair of a photovoltaic cell pair array of the photovoltaic a/c electricity generator of FIG. 1.

Lastly, in FIG. 8E of the sequence, the disk has moved further counterclockwise such that a cutout 16 has moved fully over solar cell 20B such that solar cell 20B is again 100% exposed (0% covered) while a covering 18 has again moved fully over the solar cell 20A such that the solar cell 20A is 0% exposed (100% covered). Particularly, the cutout 16 is fully over the solar cell 20B thus fully exposing solar cell 20B, while at the same time, a covering 18 is fully over the solar cell 20A thus fully shading (covering or blocking) the solar cell 20A. A peak negative current is thus again provided at output terminals $A_{out}$ and $B_{out}$ which is shown on the graph of FIG. 8E as current point $i_{8E}$. Again, it should be appreciated that the rotational movement of the disc 15 from point shown in FIG. 8D to that shown in FIG. 8E gradually exposes and covers the solar cells, as described above, to create the gradual and not stepped a/c waveform as depicted in the graph of FIG. 8E. FIG. 8E completes a full cycle of the a/c waveform.

Referring back to FIG. 3, the total number of solar cells 20 must be an even number since two solar cells 20 are utilized to provide a solar cell pair having a single a/c junction. Multiple solar cell pairs are connected together to increase the voltage or amperage depending on the connection. Connection of all of the solar cell pairs of the array 21 produces a single phase a/c waveform. The solar cell pairs may use three connected banks of solar cells pairs to achieve a three-phase a/c waveform. In FIG. 3, since the total number of solar cell pairs is fifteen (15) they all can be connected to form a single phase a/c waveform, or they can be divided into three (3) banks of five (5) solar cell pairs each to achieve a three-phase a/c/ waveform.

Figure 6:
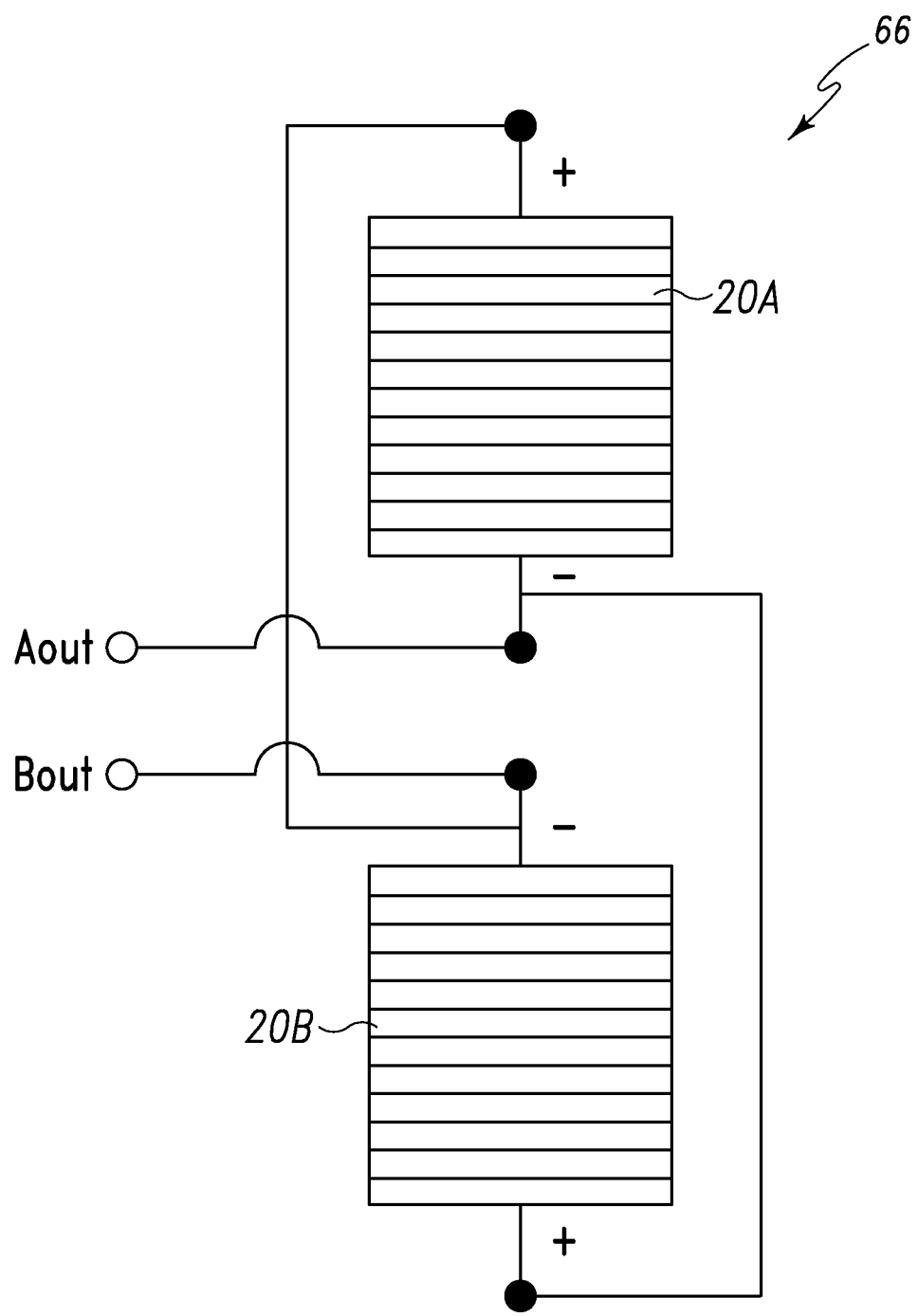
FIG. 6 is a diagram illustrating the anti-parallel connection of a photovoltaic cell pair as used in the photovoltaic a/c electricity generator of FIG. 1.

Referring additionally to FIG. 6, a solar cell pair 66 of solar cells 20A and 20B is shown. As can be seen, the solar cell pair 66 is connected in anti-parallel to provide an a/c junction (i.e. two a/c output terminals $A_{out}$ and $B_{out}$). Particularly, the positive terminal of the solar cell 20B is connected to the negative terminal of the solar cell 20A, while the positive terminal of the solar cell 20A is connected to the negative terminal of the solar cell 20B. It should be appreciated that FIG. 6 is illustrative of the manner in which solar cell pairs 66 are connected and form an a/c junction. Other configurations are contemplated. In FIG. 3 for example, two adjacent solar cells 20 are connected in anti-parallel to provide a solar cell pair such that junctions 60 and 61 (as seen in FIGS. 3 and 5) correspond to the two a/c output terminals $A_{out}$ and $B_{out}$.

A single solar cell pair 66 may be used to create a/c electricity utilizing an appropriately fashioned rotating disc. A single solar cell pair would thus produce a single phase a/c waveform. Three, single solar cell pairs can produce a three-phase a/c waveform. Multiple, single solar cell pairs can produce a multi-phase a/c waveform. However, to generate a 60 Hz a/c waveform, the disc (having only a single cutout) would have to spin at a rate of sixty revolutions per second. Therefore, multiple solar cell pairs may be connected together to provide a single a/c junction. This allows voltage and amperage to be increased as desired since the number of such series or parallel connected solar cells is unlimited, as well as slow down the rate of revolution of the disc 15.

Figure 7:
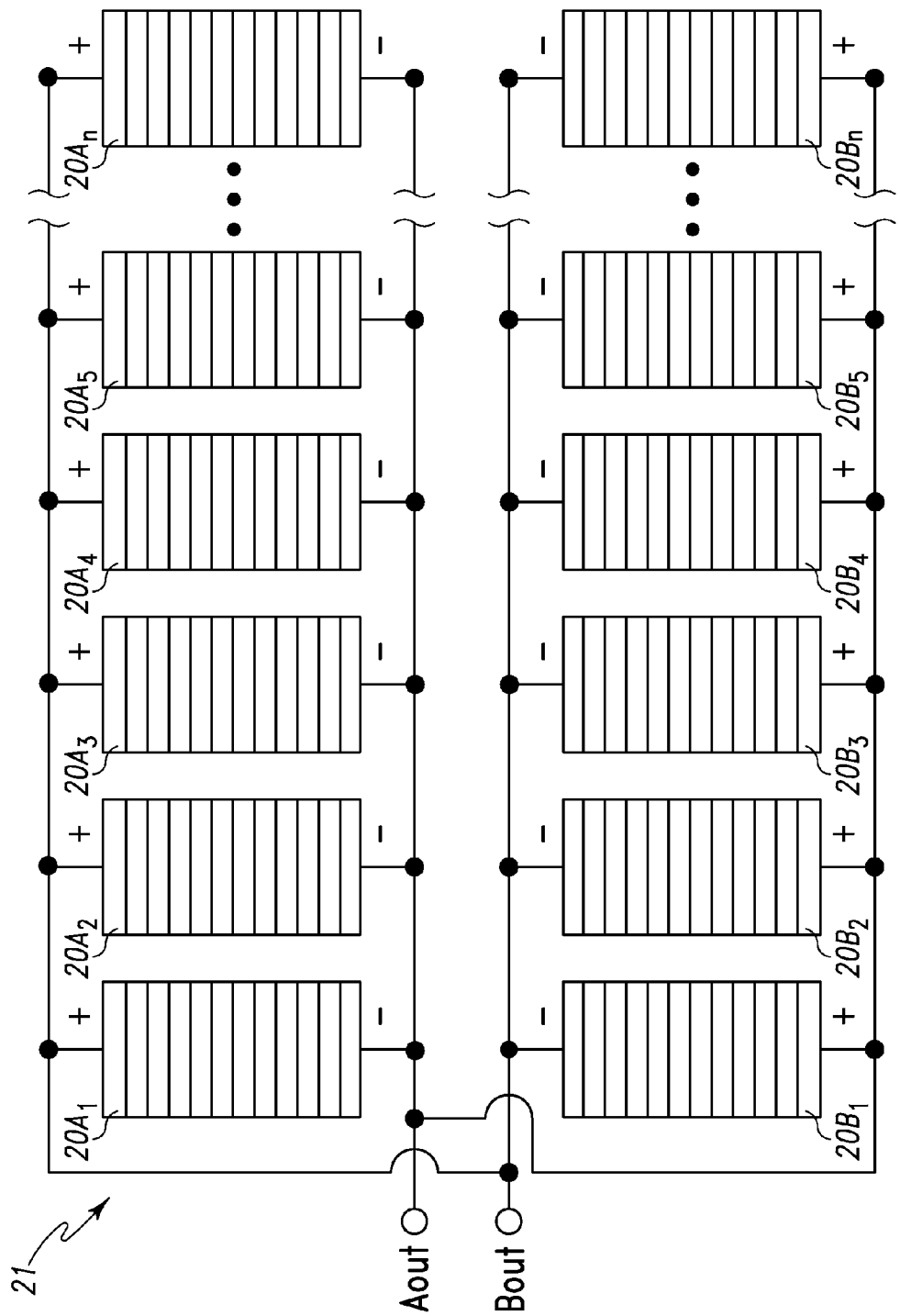
FIG. 7 is a diagram illustrating the parallel connection of an exemplary photovoltaic cell pair array as may be used in the photovoltaic a/c electricity generator of FIG. 1.

Referring to FIG. 7, the array 21 is shown connected for a single phase a/c waveform wherein any number of solar cells represented by solar cells $20A_1$, $20A_2$, $20A_3$, $20A_4$, $20A_5$ through $20A_n$ are coupled to form the single a/c junction terminal $A_{out}$, while any number of solar cells represented by solar cells $20B_1$, $20B_2$, $20B_3$, $20B_4$, $20B_5$ through $20B_n$ are coupled to form the single a/c junction terminal $B_{out}$, thereby forming a "solar cell pair". The solar cells 20 are shown connected in parallel to increase the amperage and maintain the voltage. Connecting the solar cells 20 in series would increase the voltage and maintain the amperage. In FIG. 3, the solar cell array 21 is wired to produce single phase a/c electricity. Each solar cell pair of the array 21 has the first and second a/c junctions 60, 61 which can be seen in FIG. 5 to be connected to provide a single a/c junction 56, 58. As such one of the output terminals 46, 48 would provide the single phase a/c electricity.

The connections 24 to and from the phase synchronizer 40, as best discerned in FIG. 5, provide a/c output from the phase synchronizer and signal input to the phase synchronizer. Terminals 46 and 48 provide a/c electricity output. Terminal 51 provides a shared signal input, while terminal 52 provide a commercial signal input. These can be used by the phase synchronizer to regulate the present a/c generator.

Figure 9:
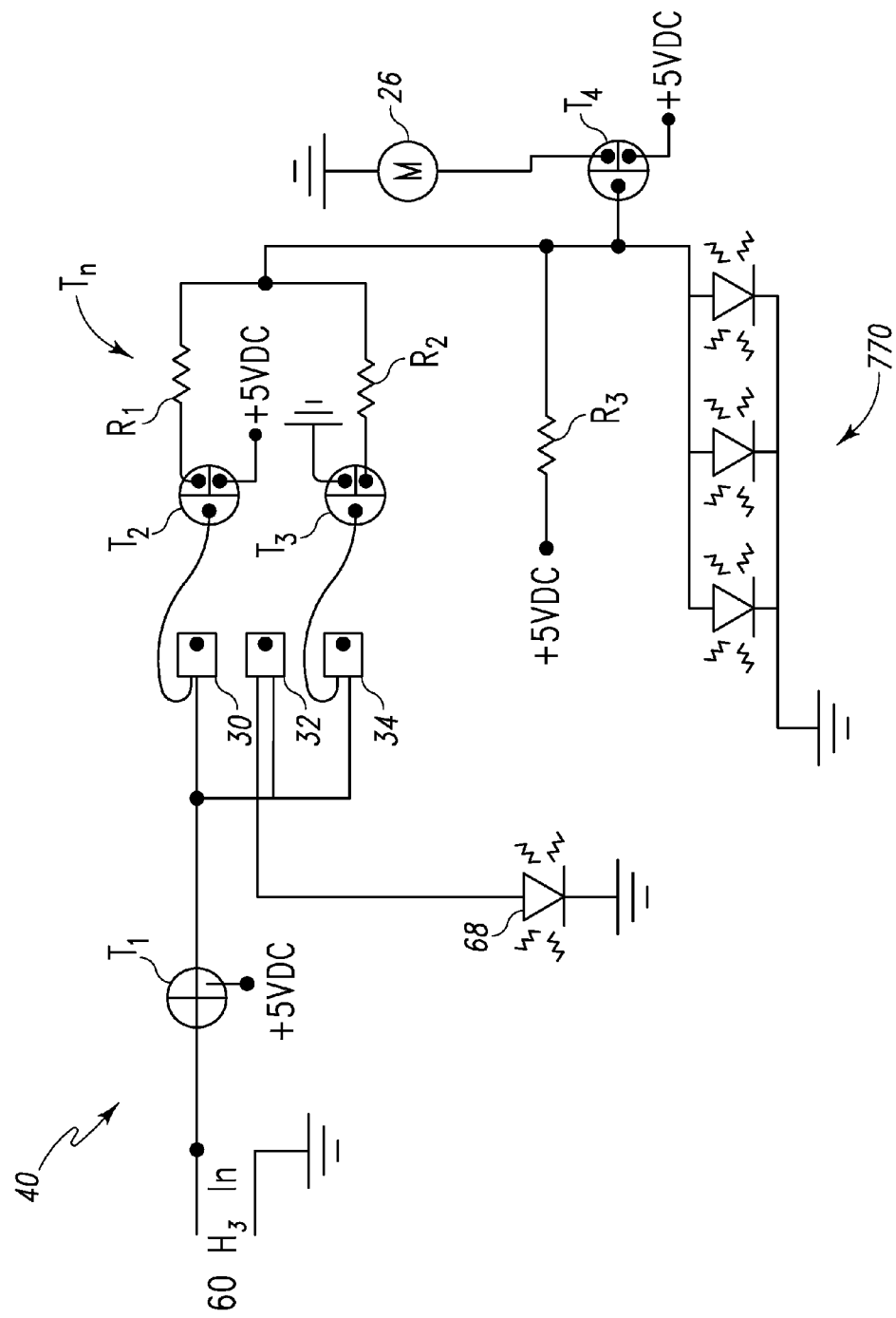
FIG. 9 is a schematic diagram of an exemplary phase synchronizer as used in the photovoltaic a/c electricity generator of FIG. 1.

FIG. 9 is a schematic of an exemplary embodiment of the motor control portion of the phase synchronizer 40. Motor speed is controlled in order to adjust the rotation rate of the disc 15 to provide a correct phase. As discerned in FIGS. 2 and 3, the present solar cell a/c electricity generator 10 includes three (3) photo or opto transistors 30, 32, and 34 that are situated proximate one solar cell 20. Particularly, a first phototransistor 30 is positioned ahead of the solar cell $20_P$ (see FIG. 3) as per counterclockwise rotation of the disc 15. A second phototransistor 32 is positioned at the middle of the solar cell $20_P$, while a third phototransistor 34 is positioned at the end of the solar cell $20_P$. The first, second and third phototransistors 30, 32, 34 work to provide a signal to control the motor which controls the rate of rotation of the disc 15 which controls the frequency of the generated a/c electricity. Although 60 Hz is shown as an input (a predetermined operating frequency) to the phase synchronizer, other frequencies can be generated and synchronized by the present solar cell a/c electricity generator 10. The inputted signal provides power for the phototransistors 30, 32, 34 through transistor $T_1$. The phototransistors detect phase of the waveform through rotation of the disc 15 and, particularly the cutouts 16 and/or the coverings 18 relative to the phototransistors 30, 32, 34.

The phototransistor 30 provides a slow phase signal, the phototransistor 32 provides an in-phase signal, while the phototransistor 34 provides a fast phase signal. The phototransistors provide their signals to the signal conditioning network $T_N$ which, in turn, provides a signal to the motor 26. Phototransistor 30 connects through transistor $T_2$, while phototransistor 34 connects through transistor $T_3$. An in-phase LED 68 is provided for indicated when the waveform is in phase. As well, a bank of LEDs 770 may be provided to provide visual indication of phase. It should also be appreciated that the resistor $R_1$ and $R_2$ may be variable resistors if desired to provide adjustment to the signal conditioning network $T_N$.

Figure 10:
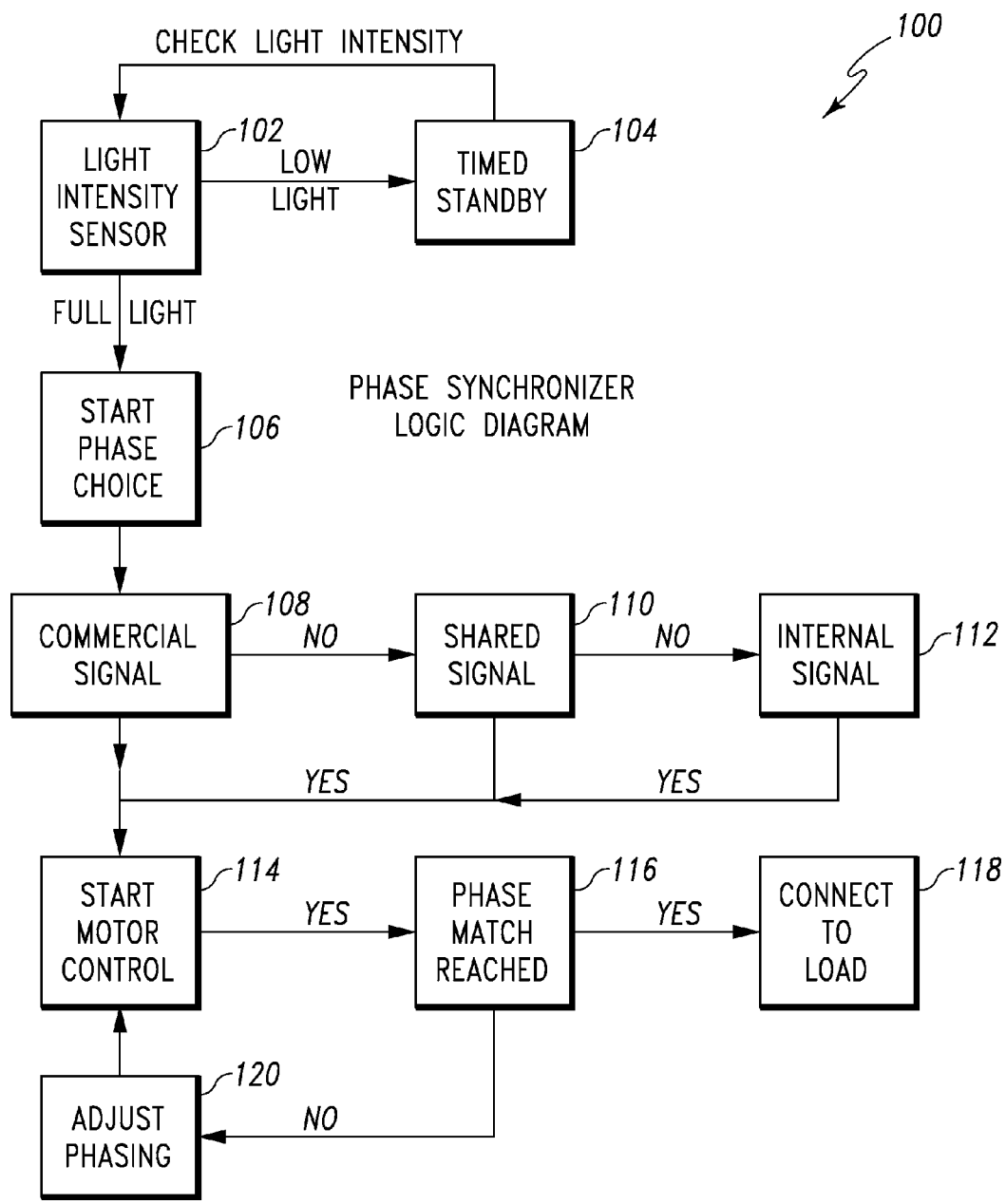
FIG. 10 is a flow chart illustrating a logic diagram of an exemplary embodiment of the phase synchronizer of the photovoltaic a/c electricity generator of FIG. 1.

FIG. 10 is a flow chart 100 of an exemplary manner of operation of the present solar cell a/c electricity generator 10. Through use of the photocell 42, the light intensity is checked via the light sensor 102. If there is low light or no light, the generator 10 goes into a timed standby 104. At the end of the standby period, light intensity is checked again 102. If there is sufficient light, the phase choice is started 106. It should be appreciated that the check light intensity portion may be excluded when there is a switched on and off. After the start of phase choice 106, it is determined whether a commercial signal is detected 108. If no, then it is determined whether it is a shared signal 110. If yes then on to motor control 114. If no, then it is determined whether the signal is an internal signal 112. Motor control 114 is then started if it is. If a commercial signal is detected at 108, then motor control 114 is started.

Once motor control is started, it is determined whether phase match is reached 116. If yes, then the generator 10 will connect to a load 118. If no, then phasing is adjusted 120. Thereafter, it is determined when phase match is reached in order to connect to load 118. Also, there may be a periodic check or ongoing check to determine phase match with a possible disconnect of the load if phase match is not occurring.

It should also be appreciated that the present solar cell a/c electricity generator 10 may be one of a plurality of solar cell a/c electricity generators that can form a power station or any wattage assembly. A plurality of solar cell a/c electricity generators may be connected as desired to provide various power configurations.

While the invention has been illustrated and described in detail in the drawings and foregoing description, the same is to be considered as illustrative and not restrictive in character, it being understood that only a preferred embodiment has been shown and described and that all changes and modifications that come within the spirit of the invention are desired to be protected.

What is claimed is:

1. A method of generating alternating current electricity comprising the steps of:

providing a base;

providing a plurality of pairs of first and second solar cells supported on the base and connected in anti-parallel to form a two-terminal a/c junction with each a/c junction connected to one another to form a first a/c electricity output terminal as one half of the two-terminal a/c junction and second a/c electricity output terminal as another half of the two-terminal a/c junction;

providing a motor supported on the base;

providing a disc coupled to the motor for rotation by the motor, the disc having a plurality of spaced apart cutouts defining a series of openings and continuities;

gradually exposing and covering each one of the plurality of pairs of first and second solar cells by rotation of the disc by the motor to rotate the series of openings and continuities alternately over the plurality of pairs of first and second solar cells to produce alternating current electricity at the first and second a/c electricity output terminals.

2. The method of claim 1, wherein the plurality of pairs of first and second solar cells are annularly situated on the base.

3. The method of claim 2, wherein first and second cells of each solar cell pair are adjacent one another on the base.

4. The method of claim 2, further comprising the step of:

providing a motor solar cell connected to the motor to provide electricity to operate the motor.

5. The method of claim 4, further comprising the step of:

providing a phase synchronizer operable to adjust phase of the alternating current electricity at the first and second a/c electricity output terminals.

6. The method of claim 5, wherein the phase synchronizer utilizes phototransistors for determining phase of the rotating disc.

7. The method of claim 2, wherein the plurality of first and second solar cell pairs are connected to provide single phase alternating current electricity.

8. The method of claim 2, wherein the plurality of first and second solar cell pairs are connected to provide three phase alternating current electricity.

* * * * *